(12) United States Patent
Bousquet et al.

(10) Patent No.: US 10,451,489 B2
(45) Date of Patent: Oct. 22, 2019

(54) THERMAL EVENT SENSOR

(71) Applicant: THE CHARLES STARK DRAPER LABORATORY, INC., Cambridge, MA (US)

(72) Inventors: Rob A. Bousquet, Waltham, MA (US); Murali Chaparala, Newton, MA (US); Brent M. Hollosi, Medford, MA (US); Zachary R. Smigelski, Hyde Park, MA (US); Wes Uy, Quincy, MA (US); Geremy Freifeld, Waltham, MA (US)

(73) Assignee: THE CHARLES STARK DRAPER LABORATORY, INC., Cambridge, MA (US)

( * ) Notice: Subject to any disclaimer, the term of this patent is extended or adjusted under 35 U.S.C. 154(b) by 357 days.

(21) Appl. No.: 15/205,401

(22) Filed: Jul. 8, 2016

(65) Prior Publication Data

US 2017/0227405 A1    Aug. 10, 2017

Related U.S. Application Data

(60) Provisional application No. 62/191,015, filed on Jul. 10, 2015.

(51) Int. Cl.
| *G01K 7/01* | (2006.01) |
| *G01K 3/04* | (2006.01) |
| *H01L 27/088* | (2006.01) |
| *H01L 29/788* | (2006.01) |

(52) U.S. Cl.
CPC ............. *G01K 7/01* (2013.01); *H01L 27/088* (2013.01); *H01L 29/7886* (2013.01)

(58) Field of Classification Search
CPC .......... G01K 11/00; G01K 13/00; G01K 3/04; G01K 7/01; H01L 27/088; H01L 29/7886
USPC ........................................................ 374/178
See application file for complete search history.

(56) References Cited

U.S. PATENT DOCUMENTS

| 3,660,819 | A | | 5/1972 | Frohman-Bentchkowsky |
| 3,854,337 | A | | 12/1974 | Moran et al. |
| 5,265,435 | A | * | 11/1993 | Richardson .......... B60H 1/3222 62/133 |
| 5,917,416 | A | * | 6/1999 | Read ...................... G01K 3/005 340/584 |
| 6,034,607 | A | * | 3/2000 | Vidaillac .................. G01K 1/14 340/529 |
| 8,776,790 | B2 | * | 7/2014 | Gentner ................ A61M 16/00 128/204.18 |

(Continued)

FOREIGN PATENT DOCUMENTS

| CN | 101102053 A | 1/2008 |
| CN | 101581767 A | 11/2009 |

(Continued)

*Primary Examiner* — Yaritza Guadalupe-McCall
(74) *Attorney, Agent, or Firm* — Lando & Anastasi, LLP (57) ABSTRACT

A thermal event sensor includes a charge storage component formed on a substrate, configured to hold an initial charge, and configured to lose charge at a rate dependent upon temperature. A sensing interface is coupled to the charge storage component and a readout mechanism is coupled to the sensing interface. The readout mechanism senses a remaining charge on the charge storage component and provides a readout value indicative of the remaining charge.

17 Claims, 8 Drawing Sheets

(56) References Cited

U.S. PATENT DOCUMENTS

| | | | | |
|---|---|---|---|---|
| 8,870,453 | B2* | 10/2014 | Branch | G01K 3/04 |
| | | | | 340/588 |
| 9,683,749 | B2* | 6/2017 | Bravard | F24D 19/1096 |
| 9,806,705 | B2* | 10/2017 | Landry | H02M 1/44 |
| 9,846,479 | B1* | 12/2017 | Brown | G06F 1/3296 |
| 9,857,091 | B2* | 1/2018 | Robideau | F24F 11/30 |
| 10,163,312 | B2* | 12/2018 | Jenkins | H05B 37/0227 |
| 2002/0180406 | A1* | 12/2002 | Lamothe | G01K 3/005 |
| | | | | 320/150 |
| 2011/0011400 | A1* | 1/2011 | Gentner | A61M 16/00 |
| | | | | 128/204.18 |
| 2011/0115636 | A1* | 5/2011 | Zhang | G01K 1/024 |
| | | | | 340/584 |
| 2011/0140913 | A1* | 6/2011 | Montenero | G08B 21/0233 |
| | | | | 340/870.07 |
| 2011/0169481 | A1* | 7/2011 | Nguyen | H01M 2/1055 |
| | | | | 324/126 |
| 2013/0072763 | A1* | 3/2013 | Shtalryd | A61B 5/01 |
| | | | | 600/301 |
| 2013/0157453 | A1* | 6/2013 | Ahn | H01L 29/0673 |
| | | | | 438/591 |
| 2014/0121557 | A1* | 5/2014 | Gannon | A61B 5/002 |
| | | | | 600/549 |
| 2014/0149064 | A1* | 5/2014 | Davidson | G06F 15/00 |
| | | | | 702/130 |
| 2014/0151079 | A1* | 6/2014 | Furui | B25F 5/02 |
| | | | | 173/46 |
| 2015/0105687 | A1* | 4/2015 | Abreu | A61B 5/01 |
| | | | | 600/549 |
| 2015/0276500 | A1* | 10/2015 | Walker | G01K 7/16 |
| | | | | 365/189.011 |
| 2016/0090105 | A1* | 3/2016 | Neubecker | B60W 40/02 |
| | | | | 701/23 |
| 2016/0146489 | A1* | 5/2016 | Najafi | F24F 11/0001 |
| | | | | 236/49.3 |
| 2016/0300845 | A1* | 10/2016 | Ishizaki | H01L 27/11582 |
| 2017/0227405 | A1* | 8/2017 | Bousquet | G01K 7/01 |
| 2018/0059052 | A1* | 3/2018 | Hoque | G01N 27/4148 |
| 2018/0352014 | A1* | 12/2018 | Alsina | H04L 12/2803 |

FOREIGN PATENT DOCUMENTS

| | | |
|---|---|---|
| EP | 1862785 A1 | 12/2007 |
| JP | 2009273089 A | 11/2009 |

* cited by examiner

THERMAL EVENT SENSOR

CROSS-REFERENCE TO RELATED APPLICATIONS

This application claims the benefit of co-pending U.S. Provisional Patent Application No. 62/191,015 titled PASSIVE CMOS THERMAL SENSOR filed on Jul. 10, 2015, which is herein incorporated by reference in its entirety for all purposes.

FEDERALLY SPONSORED RESEARCH

This invention was made with government support under Contract No. HR0011-15-C-0009 awarded by DARPA/MTO. The government has certain rights in the invention.

BACKGROUND

Many semiconductors and integrated circuits, or the devices and products in which they are components, are designed to precise performance standards and may be certified to comply with such standards or may be asserted to achieve certain performance criteria. Tampering in the supply chain may cause parts, components, assemblies, devices, or systems not to perform to the level expected, or may cause them to outright fail, possibly with extreme consequences. Accordingly there exists a need to detect potential tampering with parts, components, and assemblies in the supply chain, from initial component manufacture to final device or system assembly.

SUMMARY OF INVENTION

The present disclosure relates to sensors, and more particularly to semiconductor-based sensors that can indicate whether a device or component may have been subjected to tampering or other negative manipulation or effect by sensing exposure to an extreme temperature event.

According to one aspect, a thermal event sensor is provided. The thermal event sensor includes a charge storage component configured to hold an initial charge and to lose charge at a rate dependent upon a temperature of the charge storage component. A sensing interface is coupled to charge storage component and configured to allow a readout mechanism to interact with a remaining charge on the charge storage component.

In an embodiment, the charge storage component is formed on a substrate.

In an embodiment, the thermal event sensor further includes a readout mechanism coupled to the sensing interface and configured to sense the remaining charge. Further to this embodiment, the readout mechanism may be configured to provide a readout value indicative of the remaining charge.

In an embodiment, the readout mechanism senses the remaining charge without substantially altering the remaining charge. In an alternate embodiment the readout mechanism may alter or remove the charge when sensing the remaining charge.

In an embodiment, the charge storage component includes a floating gate and the sensing interface includes at least one field effect transistor channel in proximity to the floating gate and coupled to the floating gate through a gate oxide.

In a further embodiment, the floating gate is formed of a single layer of polysilicon material.

In an embodiment, the charge storage component includes a plurality of metal layers separated by corresponding layers of field oxide, the plurality of metal layers being electrically coupled to one another and electrically coupled to the floating gate.

In an embodiment, the sensing interface includes at least two field effect transistor channels coupled to the floating gate, the at least two field effect transistor channels formed in a lateral configuration to each other.

In an embodiment, the sensing interface includes a control gate in proximity to the floating gate.

In an embodiment, the readout mechanism is one of an electrical, optical, infrared, or photoluminescent mechanism.

In an embodiment, the readout mechanism is a readout circuit. In a further embodiment, the readout circuit is coupled to the field effect transistor channel and configured to detect a sense current through the field effect transistor channel.

In an embodiment, a charging mechanism is coupled to the sensing interface and configured to place an initial charge on the charge storage component. Further to this embodiment, the charging mechanism is one of an electrical, optical, infrared, or photoluminescent mechanism. Further to this embodiment, the charging mechanism may be configured to place the initial charge on the charge storage component via at least one of Fowler-Nordheim tunneling and hot carrier injection, and the charging mechanism may be configured to be disabled after placing the initial charge on the charge storage component.

In an embodiment, the charge storage component includes a doped dielectric configured to hold the initial charge by trapping the initial charge.

In another aspect, a method of detecting thermal events is provided. The method includes providing, via a charging mechanism, a first charge on a charge storage component at a first point in time, the charge storage component configured to lose charge at a rate corresponding to temperature; sensing a remaining charge on the charge storage component at a second point in time; and comparing the sensed remaining charge to the first charge.

In an embodiment, sensing the remaining charge includes sensing a conductivity of a transistor channel in proximity to the charge storage component, the remaining charge influencing a field effect on the transistor channel.

In an embodiment, providing a first charge on a charge storage component includes depositing charge on a plurality of metal layers separated by corresponding layers of field oxide, the plurality of metal layers being electrically coupled to one another.

In an embodiment, the method further includes determining whether the charge storage component has been exposed to a thermal event based upon the comparison.

In an embodiment, the method further includes disabling the charging mechanism after providing the first charge.

In another aspect, a method of detecting temperature variations is provided. The method includes providing, via a charging mechanism, a first charge on a charge storage component at a first point in time, the charge storage component being configured to lose charge at a rate corresponding to temperature; determining an expected charge remaining on the charge storage component at a second point in time; sensing a second charge remaining on the charge storage component at the second time; comparing the second charge to the expected charge; and determining based on the comparison whether the charge storage component has been exposed to a temperature variation outside of an allowed range.

In an embodiment, sensing the remaining charge includes sensing a conductivity of a transistor channel in proximity to the charge storage component, the remaining charge influencing a field effect on the transistor channel.

In an embodiment, providing a first charge on a charge storage component includes depositing charge on a plurality of metal layers separated by corresponding layers of field oxide, the plurality of metal layers being electrically coupled to one another.

In an embodiment, the method further includes disabling the charging mechanism after providing the first charge.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Traditional temperature sensors indicate temperature at any given moment in time and require power while in operation. According to aspects and embodiments of thermal event sensors and methods as disclosed herein, thermal events are passively detected and a readout of the sensor provides an indication of whether the component or device has been subjected to a temperature outside of normal expected ranges, which may indicate tampering. Embodiments of a thermal event sensor as disclosed herein utilize a charge storage component that may exhibit a stable (or slowly decaying) electric charge during routine handling, but that will exhibit a significant charge loss when subjected to extreme temperature events.

The charge storage component may include one or more substrate layers that can store or trap charge and is dielectrically isolated from other components and materials. The charge storage component substrate material may be a conductor, a semi-conductor, or a dielectric material. For example, the charge storage component substrate material may be metal, polysilicon, doped dielectric, or other materials, or a combination of any of these, capable of holding or trapping a charge. In at least one embodiment the charge storage component includes one or more metal layers and a polysilicon floating gate interface to an integrated circuit structure. In another embodiment, the charge storage component may be a non-conducting dielectric material configured for charge trapping. In various embodiments, the charge storage component includes one or more substrate layers and is compatible with integrated circuit fabrication techniques.

As discussed in more detail below, a substrate architecture of the charge storage component will exhibit inherent thermally-dependent charge-loss mechanisms that may be exploited, in either a passive or active manner, to detect thermal signatures for various events. The thermally-dependent charge-loss mechanisms may be altered or tuned by modification of the substrate layer geometry and/or addition of other substrates of alternate materials with various geometries. Once fabricated, charge can be transferred to the charge storage component by either passive and/or active mechanisms, and the stored charge may be sensed through passive or active techniques in such a manner as not to perturb or substantially alter the charge, thereby allowing for subsequent further sensing of the stored charge.

Embodiments disclosed herein may be used to determine whether a thermal event has occurred by detecting the remaining charge on the charge storage component at any given time and comparing the remaining charge to any previously known charge state. In at least one embodiment, the remaining charge on the charge storage component may be detected through a polysilicon coupling element of the charge storage component that is a Floating Gate (FG) of a Metal-Oxide Semiconductor Field Effect Transistor (MOSFET). The remaining charge on the charge storage component will influence a channel of the MOSFET through the floating gate. The response of the MOSFET semiconductor channel will depend upon the remaining charge as described below and may be detected by a readout mechanism. For example, in at least one embodiment, a single-poly lateral memory cell structure may provide a suitable interface to allow a readout circuit to detect the charge on the charge storage component, because the stored charge, acting through the floating gate interface, influences the conductivity of the semiconductor channel.

Extreme temperatures will dramatically affect the rate of discharge. Accordingly, the remaining charge at any particular time can indicate the cumulative history of exposure to temperature excursions; defined herein as temperatures significantly outside of the normal expected temperature range for use or storage of the device. In some embodiments, the initial charge placed on the charge storage component is sufficient for the entire expected lifetime of the sensor (e.g., the lifetime of the device in which the sensor is used), such that the remaining charge at any time will be sufficient for detection and the sensor need not be erased, reset, or recharged. Additionally, reading from the sensor may be a non-invasive activity that does not alter, reset, or erase the sensor's stored charge or record of temperature history.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 1:
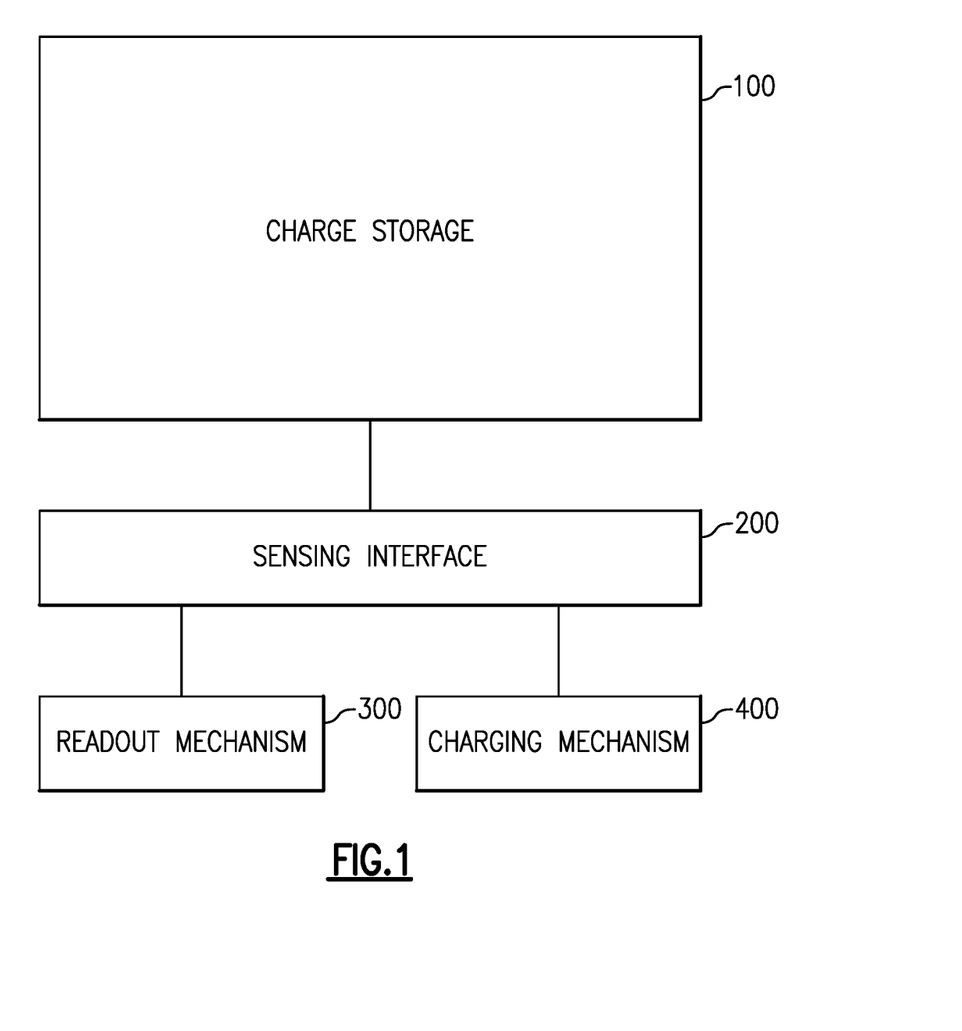
FIG. 1 is a block diagram of a thermal event sensor in accord with aspects of the present invention.

Referring to FIG. 1, there is illustrated a high level block diagram of one example of a thermal event sensor. The thermal event sensor of FIG. 1 includes a charge storage device 100, a sensing interface 200, a readout mechanism 300, and a charging mechanism 400. The readout mechanism 300 is coupled to the charge storage device 100 via the sensing interface 200. The charging mechanism 400 may also be coupled to the charge storage device 100 via the sensing interface 200. The charging mechanism 400 may be used to place an initial charge on the charge storage device 100, and may be usable to place a new charge at a later time or to discharge the charge storage device 100. The charging mechanism 400 may be supplied with the sensor for periodic charging of the sensor, but alternatively may be used only during original manufacture or initial charging, and may be removed, destroyed, or otherwise not part of the sensor. Additionally, once an initial charge is placed on the sensor, i.e., on the charge storage device 100 of the sensor, the charge storage device 100 or the sensing interface 200, or both, may be configured to disallow any further placement of charge to prevent tampering with the future indication of exposure to temperature excursions.

At least one example of a charge storage device 100, a sensing interface 200, a readout mechanism 300, and a charging mechanism 400 are described in detail below. The readout mechanism 300 and charging mechanism 400 each may include, for example, circuitry, optics, photoluminescence, infrared, etc. and may involve interaction with various particles, charged or neutral, with or without resting mass, such as electrons, photons, etc.

Figure 2A:
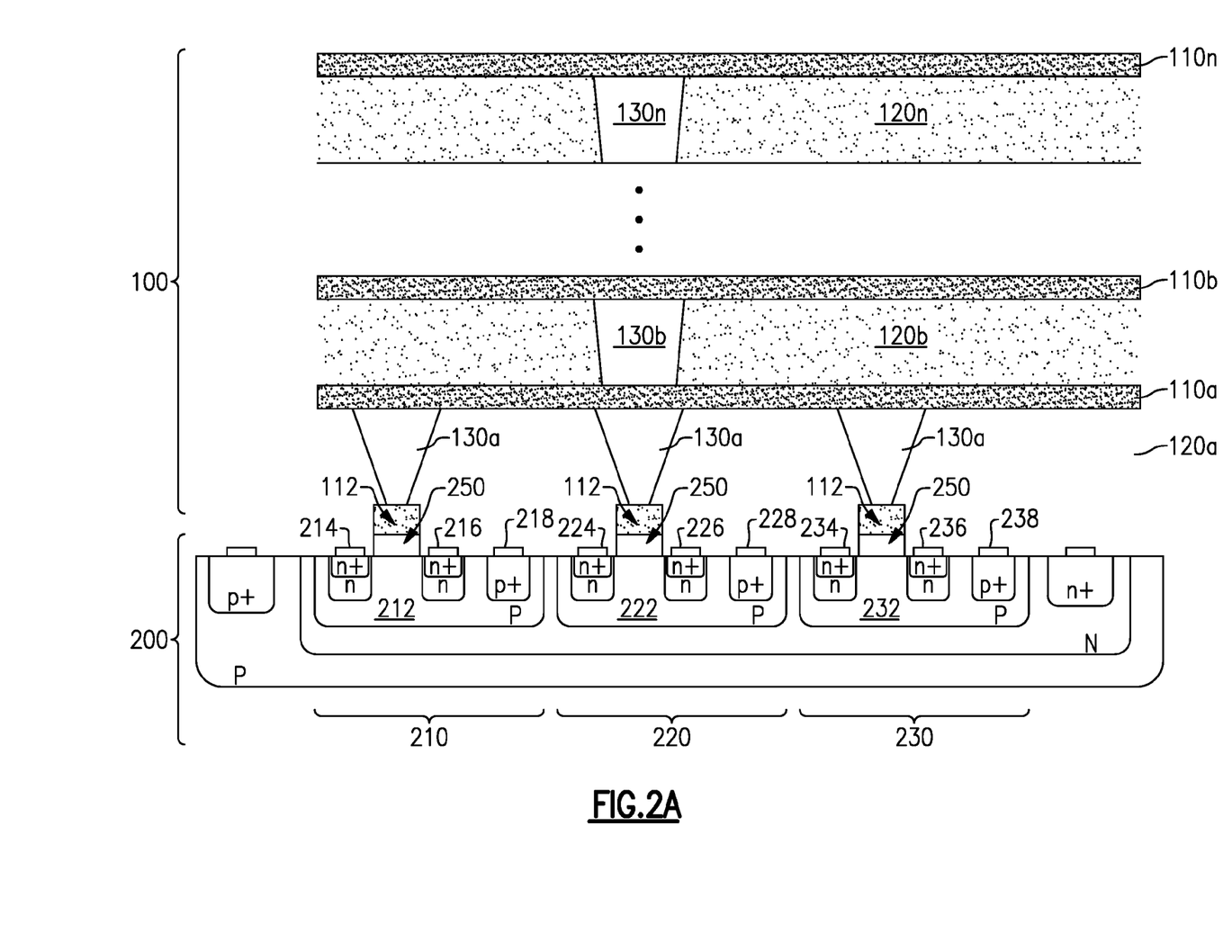
FIG. 2A is a schematic diagram of one example of a thermal event sensor in accord with aspects of the present invention.

Example embodiments of a charge storage device 100 and a sensing interface 200 are illustrated in FIG. 2A. As shown, the example charge storage device 100 is a multi-layer construct of metal layers 110 with field oxide 120 and vias 130 between each metal layer 110a through 110n. The metal layers 110 may be any suitable material capable of holding and distributing an electric charge. The field oxide 120 is an inter-layer dielectric that does not conduct electric charge but may accept or allow electrons from the metal layers 110 to tunnel or diffuse within the field oxide 120 during thermionic emission from the metal layers 110 and may allow electrons to be captured by excess ions, e.g., due to ionic contamination, within the field oxide 120. The vias 130 are made of electrically conductive material, e.g., metal, and the vias 130 electrically connect the metal layers 110 together so that one or more of the metal layers 110 act together to distribute or share a stored charge. In the example embodiment of FIG. 2A, the charge storage device 100 also includes a floating gate 112 electrically coupled to the metal layers 110 through one or more vias 130a. The floating gate 112 is a component of the charge storage device 100 that interacts with the sensing interface 200, as described further below, and may be a polysilicon or other material. The example charge storage device 100 of FIG. 2A is shown as a stack-up of metal layers separated by field oxide, but in various embodiments the charge storage device 100 may take other forms. For example, the charge storage device 100 may be formed of a charge-trapping dielectric material or may include varying arrangements of conductors, semiconductors, and non-conductors. Additionally, various embodiments of charge storage devices 100 may be compatible with a number of semiconductor fabrication techniques and therefore well-suited for thermal event sensors disclosed herein to be incorporated into semiconductor components and devices.

Metal-Oxide semiconductors generally, and the example charge storage device 100 of FIG. 2A, exhibit mechanisms that affect the charge on their components, such as the metal layers 110. Two such mechanisms mentioned above include thermionic emission and ionic contamination. Briefly described, thermionic emission is the emission of electrons off the surface of an object, e.g., a metal layer 110, due in part to the kinetic energy the electron has as a result of temperature. Ionic contamination causes loss of electrons near a surface of one material to positively charged ions (typically H+ ions) in the adjacent material, e.g., the field oxide 120. The negative charge of the electrons may attract the positive ions and cause the positive ions to migrate through the material and within range to "capture" an electron. The density of ionic contamination in the field oxide 120 will affect the rate of charge leakage through ionic contamination. Additionally, the amount of surface area, or the interface area, between the metal layers 110 and the field oxide 120 will affect the rate of charge leakage through both mechanisms of ionic contamination and thermionic emission. Both mechanisms are sensitive to temperature such that a higher temperature will increase the charge leakage rate due to both ionic contamination and thermionic emission.

Given a charged metal in contact with a dielectric, such as the metal layers 110 in contact with the field oxide 120 of the example charge storage device 100 in FIG. 2A, thermionic emission and ionic contamination each cause an exponential decay with differing time constants. The time constants are dependent upon temperature. Depending upon configuration parameters and the amount of electric charge, high temperature may cause a significant charge loss while a normal operating temperature may cause negligible charge leakage over a time period of interest. Alternately stated, a normal operating temperature may be associated with such a long time constant that no appreciable charge loss occurs over a portion of the sensor lifetime, while a temperature above an activation level may be associated with a shorter time constant such that a measurable loss of charge occurs even if the higher temperature is only sustained for a short period.

Additionally, ionic contamination will decrease over time as a significant number of the ions are neutralized (by having captured an electron), such that charge loss due to ionic contamination may become negligible even at high temperatures, or may cease entirely. In various embodiments, an initial charge may be chosen so that charge loss expected during handling, e.g., assembly and soldering, will tend to neutralize a significant fraction of the ionic contamination such that thermionic emission becomes the dominant mechanism post-assembly.

A charge storage device 100 may be designed with various materials and with various number and geometry of metal layers 110 and vias 130, and the field oxide 120 may be controlled for ionic contamination levels. The various design parameters will impact the total amount of charge that may be stored, the ratio of exposed charge (e.g., charge near material interfaces) to total charge, and the thermal conductance of the device, for example. Packaging and other physical structure around the device will also influence thermal conductivity. By controlling these and other design parameters, a charge storage device 100 may be designed for particular operational parameters or applications. In at least one embodiment, a charge storage device 100 may be designed for a total charge capacity and charge loss (e.g., leakage) mechanisms so that the sensor will accommodate device or component assembly and manufacturing, which will involve temperature excursion during various operations such as soldering and reflow.

In at least one embodiment, a charge storage device 100 may be designed to accommodate a sufficient initial charge such that, after anticipated handling and anticipated charge loss mechanisms during assembly and packaging, a remaining amount of charge will exhibit negligible charge loss at nominal temperatures. Any future exposure to temperature excursions will cause the remaining charge to decrease further, which may be detected by reading the sensor, i.e., sensing the remaining charge in the charge storage device 100. A readout of the charge, i.e., sensing the remaining charge, after module assembly, rework, and system assembly, for example, will establish a reference sensed charge level that will remain essentially unchanged so long as the part, component, or system is not subjected to further temperature excursions. Exposure to further temperature excursions may indicate tampering, such as an unauthorized removal of a part or component, e.g., de-soldering, and re-use of the part or component on another assembly, e.g., additional soldering.

In at least one embodiment, a charge storage device 100 may be designed with characteristics to exhibit negligible charge loss at a temperature of 100 C for a post-assembly charge level, which will be attained after all expected handling and rework. In at least one other embodiment, a charge storage device 100 may be designed to exhibit negligible charge loss at a temperature of 120 C for a post-assembly charge level. Other embodiments may be designed for negligible charge loss at other nominal temperatures. The amount of remaining charge may influence whether charge loss is negligible, therefore in various embodiments the total charge capacity of the charge storage device 100, or the initial charge placed on the charge storage device 100 regardless of capacity, may be established such that a remaining charge after system assembly will be within a range to exhibit negligible charge loss at nominal temperature yet sufficient to detect additional charge loss if the part or component is subjected to a temperature excursion, e.g., significantly above the nominal temperature.

In various embodiments, a variable and customizable design is provided for changing operational requirements or applications. For example, selecting more or fewer metal layers 110 for fabrication may allow a manufacturer to make multiple thermal event sensors with different characteristics for different applications or uses. A sensor with multiple metal layers 110 may be made customizable by removing one or more of the vias 130 to reduce the number of metal layers 110 electrically coupled together. Increasing or reducing the number of metal layers 110 connected through vias 130 allows an integrator to customize the sensor to a particular application or operational parameter. Metal layers 110 may be configured to be electrically switched in or out of connection with each other, such as by using switching transistors to interconnect one or more metal layers 110 in place of one or more of the vias 130 shown in FIG. 2A. Further, additional elements can be provided, such as parasitic elements that affect the leakage rate and/or the relationship of leakage rate to temperature, thereby allowing many variations for sensitivity, lifetime, and other parameters.

Also shown in FIG. 2A is an example embodiment of a sensing interface 200 for the charge storage device 100. The example sensing interface 200 of FIG. 2A includes three Field Effect Transistor (FET) components 210, 220, 230 with doped channels 212, 222, 232 in proximity to the floating gate 112 but separated by a dielectric insulating layer or gate oxide 250, typically an oxide such as Silicon Dioxide ($SiO_2$), for example. Each of the three FET components 210, 220, 230 has a drain contact 214, 224, 234, a source contact 216, 226, 236, and a bulk contact 218, 228, 238. The three FET components 210, 220, 230 will act individually as a control gate, a tunnel gate, and a sense transistor as described in more detail below. The floating gate 112 is a semiconductor layer, such as a polysilicon material, and in combination with the gate oxide 250 and the underlying semiconductor structure shown in FIG. 2A forms a metal-oxide-semiconductor (MOS) device similar to a single-poly floating gate lateral memory cell. In other embodiments, the floating gate 112 and the sensing interface 200 may be configured as a multi-poly stacked gate cell. For example, the sensing interface 200 may include a control gate disposed on an additional layer such that the floating gate 112 is positioned with the control gate on one side and the FET channel on another side, thus the control gate and the floating gate are "stacked" relative to each other.

The floating gate 112 may be part of the charge storage device 100 in electrical contact with the metal layers 110 through vias 130a. The floating gate 112 may be three individual floating gates in electrical connectivity with each other via the metal layer 110a through the vias 130a, or the floating gate 112 may be one contiguous floating gate connected in a manner not shown in FIG. 2A, e.g., in another plane of view. In other embodiments the floating gate 112 may be configured differently.

As discussed in more detail below, one of the FET components 210, 220, 230 is configured and used to place an initial charge on the charge storage device 100 through a tunneling process, such as Fowler-Nordheim (FN) tunneling, or Hot-Carrier Injection (HCI). Another of the FET components 210, 220, 230 is configured and used to sense the remaining charge on the charge storage device 100 at a later point in time. The third FET component is configured and used to control and impose an electric field on the charge storage device 100, via the floating gate 112, when placing an initial charge or when sensing the remaining charge.

In some embodiments there may be more or fewer FET components 210, 220, 230. For example, any of the control function, the tunnel function, or the sense function may be accommodated by a different physical structure. Accordingly, variations on the example embodiment of FIG. 2A may have more or fewer FET components 210, 220, 230, and embodiments of the devices and techniques disclosed herein are not limited to the use of three FET's. Additionally, a sensing interface 200 with different configurations may be provided in various embodiments. For example, while the example sensing interface 200 of FIG. 2A is shown as a P-doped substrate with a common N-doped well that includes multiple P-doped wells, each forming the bulk of one of the FET components 210, 220, 230, other embodiments may include a different doping arrangement and a different number and/or arrangement of substrate and/or wells. Additionally, a different sensing interface structure than that shown in FIG. 2A may be provided in various embodiments, such as, for example, carbon nanotube structures, nanowires, or non-CMOS devices.

Figure 2B:
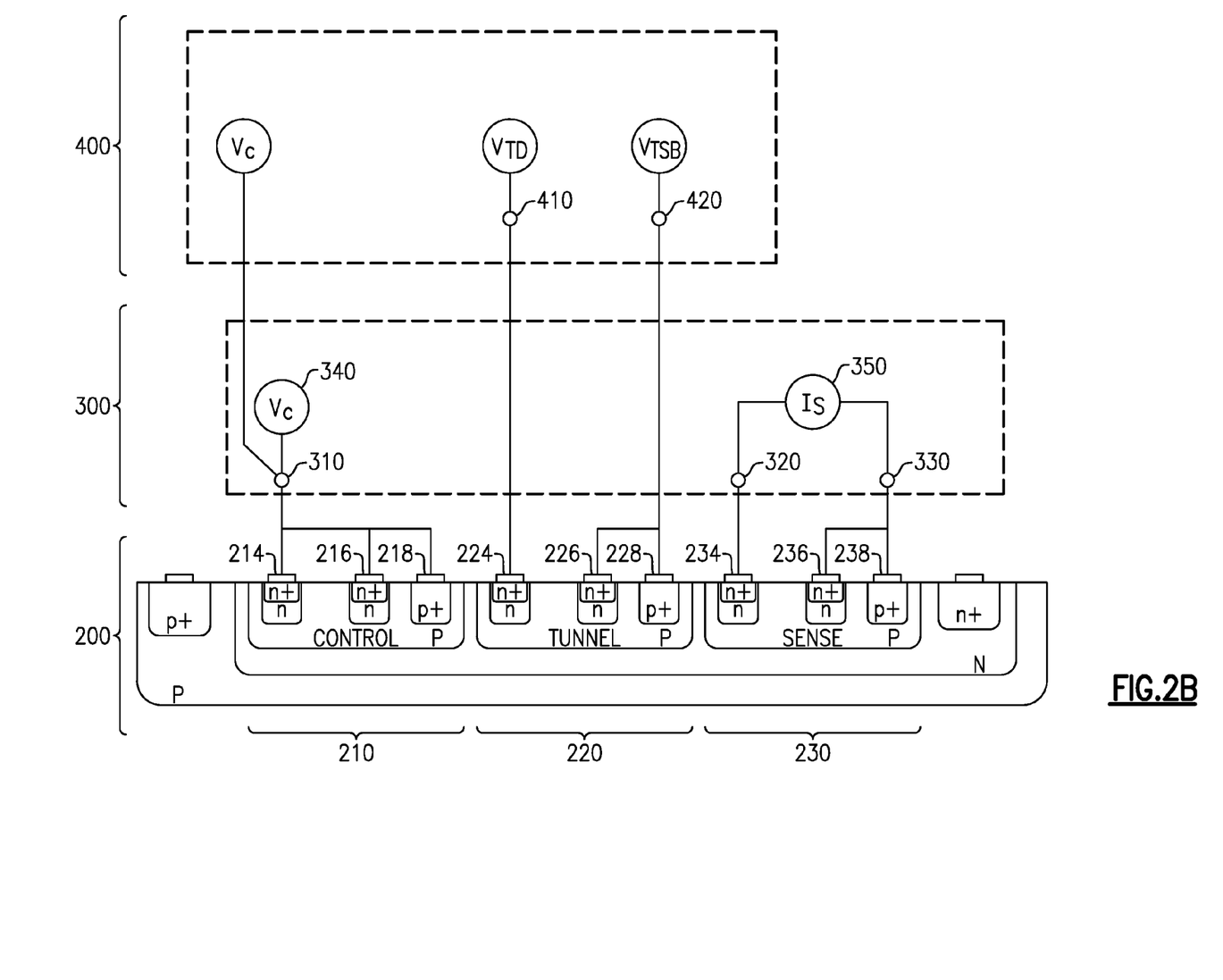
FIG. 2B is a schematic diagram of another example of a thermal event sensor in accord with aspects of the present invention.

FIG. 2B shows a further schematic diagram of the sensing interface 200 with details regarding an example connectivity of the three FET components 210, 220, 230. The example sensing interface 200 in FIG. 2B is shown with simplified electrical readout circuitry as the readout mechanism 300 and simplified electrical charging circuitry as the charging mechanism 400.

In the example sensing interface 200 of FIGS. 2A and 2B, functions are assigned to each of the three FET components 210, 220, 230, as described further below.

In the example embodiment of FIG. 2B, the FET component 230 is a sense FET 230. The conductivity of the channel of the sense FET 230, i.e., the sense channel 232, may be tested with a sense current 350 to determine a measure of the remaining charge on the charge storage device 100, as discussed further below.

In the example embodiment of FIG. 2B, the FET component 210 is a control FET 210 and is shown with its drain contact 214, source contact 216, and bulk contact 218 electrically tied together to form a single control terminal 310. The control FET 210 acts like a capacitor to increase or decrease the voltage on the floating gate 112 through capacitive coupling, and thereby increase or decrease the voltage on the charge storage device 100 and the sense channel 232, when a sense voltage 340 is applied to the control terminal 310. Thus by applying a sense voltage 340 on the control terminal 310, the conductivity of the sense channel 232 may be varied. Further, the impact of the applied sense voltage 340 will depend upon the amount of remaining charge on the charge storage device 100, thus the remaining charge may be sensed by the conductivity of the sense channel 232, as detected by the sense current 350, when a sense voltage 340 is applied to the control terminal 310. In some embodiments the sense voltage 350 applied may be zero volts, in which case the conductivity of the sense channel 232 is directly measured under the influence of the remaining charge on the charge storage device 100 via the floating gate 112 alone. An example readout circuit 300a and sensing operation is described in more detail below.

Also in the example embodiment of FIG. 2B, the FET component 220 is a tunnel FET 220 shown with two terminals; one is the D-terminal 410 providing electrical connection to the tunnel FET 220's drain contact 224, and the other is the SB-terminal 420 providing electrical connection to the source contact 226 and the bulk contact 228 tied together. The tunnel FET 220 may be used, in combination with the control FET 210, to precisely and purposefully establish or remove charge from the charge storage device 100. The tunnel FET 220 is therefore used to initially place a charge on the charge storage device 100, or at a later time could be used to remove the remaining charge and optionally place a new charge on the charge storage device 100. In various embodiments, the tunnel FET 220 may be disabled after an initial charge is placed on the charge storage device 100 to prevent tampering, i.e., to prevent someone from erasing the history of the senor by placing a new charge on the charge storage device 100.

In regular use, the sensor reacts to temperature excursion events through charge loss. Therefore, normal operation of the sensor may be passive, requiring no power once it is initially charged. The sensing interface 200 provides an interface for sensing the remaining charge at any time, but the sensing interface 200 may also be used to interact with the charge storage device 100 during normal operation, by, for example, creating a bias voltage to adjust sensitivity or activation level. The sensing interface 200 and, accordingly, the control FET 210, tunnel FET 220, and sense FET 230 are not required to be involved in the passive sensing of thermal events. The charge storage device 100 will passively lose charge to the oxides, especially when exposed to a temperature high enough to reach an activation level, without interaction from the sensing interface or any of the FET components 210, 220, 230. As discussed above and in more detail below, the FET components 210, 220, 230 may be used to place an initial charge on the charge storage device 100. Also as discussed above and in more detail below, the control FET 210 and the sense FET 230 may be used to readout, i.e., sense the remaining charge on, the charge storage device 100, to detect or determine whether an exposure to a temperature excursion, or thermal event, has occurred.

Figure 3A:
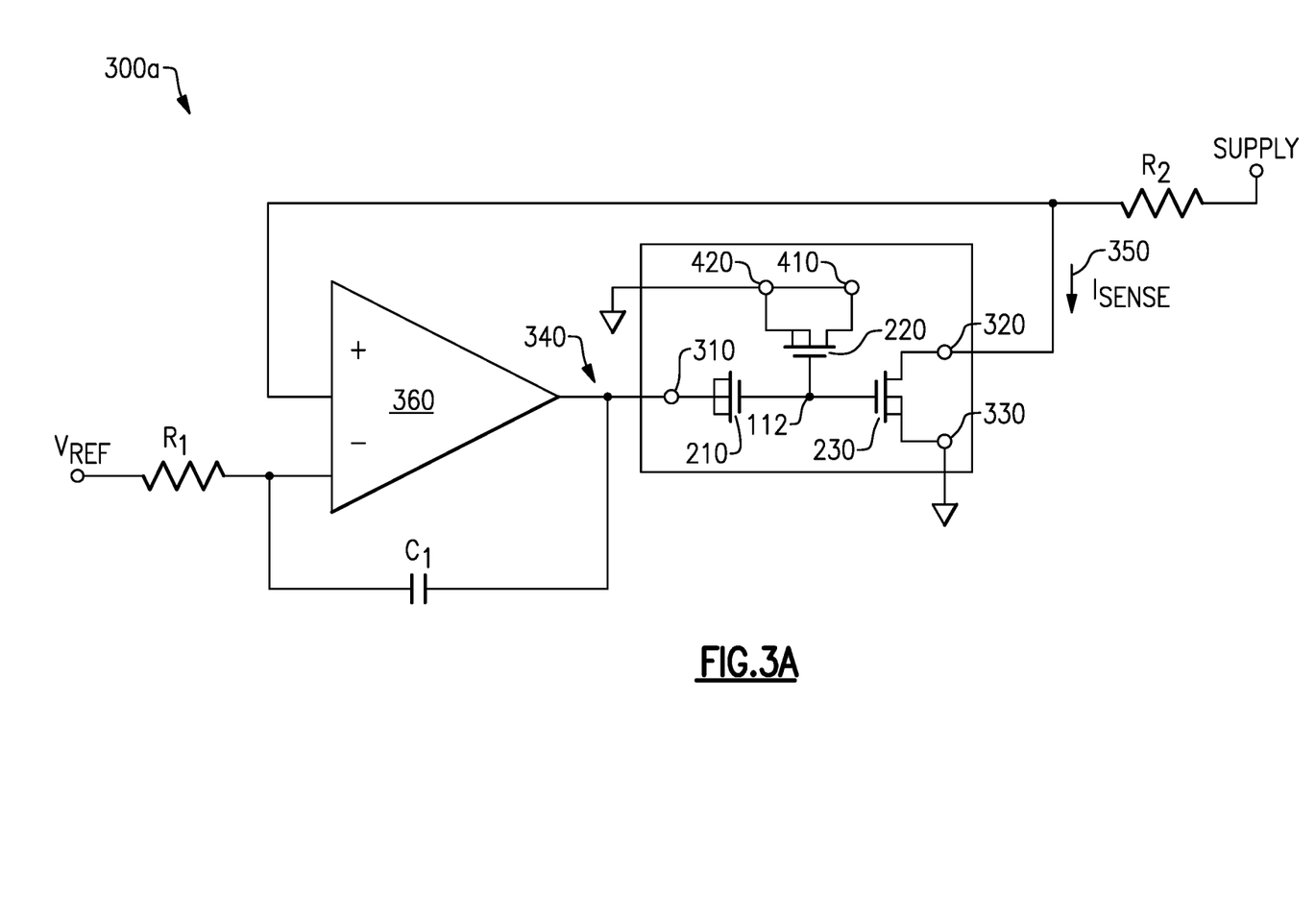
FIG. 3A is a schematic diagram of an example readout circuit in accord with aspects of the present invention.

An operation to sense or determine a remaining charge on the charge storage device 100 is described with reference to FIG. 3A, which shows an example embodiment of a readout mechanism 300. In the example of FIG. 3A, the readout mechanism 300 is shown as a readout circuit 300a that may be used in combination with the example sensing interface 200. To sense the remaining charge on the charge storage device 100, a sense voltage 340 is provided to the control FET 210, and the sense current 350 allowed to flow by the sense FET 230 is measured. As discussed above, a sense voltage 340 applied to the control terminal 310, by an op-amp 360 in the example of FIG. 3A, varies the conductivity of the sense channel 232. In accordance with varying applications and operational parameters, a particular sense current 350 through the sense FET 230 may be selected, or a particular state transition, e.g., from off to on, of the sense FET 230 may be selected, as a measurement point or criterion for sensing the remaining charge. For example, the sense voltage 340 may be varied until the sense current 350 reaches a measurement point. The sense voltage 340 that achieves a given sense current 350 is the readout voltage and is indicative of the remaining charge on the charge storage device 100. For example, a sense current 350 of one hundred micro-amps (100 μA) may be selected, and the sense voltage 340 that yields 100 μA of sense current 350 is the readout voltage, and is indicative of the remaining charge.

Alternately, the voltage applied to the control terminal 310 may be varied until the sense FET 230 makes a transition. The voltage when the transition occurs may be indicative of the remaining charge on the charge storage component.

Alternatively, in some embodiments, a particular sense voltage 340 may be selected as the measurement criteria and the resulting current through the sense FET 230 may be measured to indicate the remaining charge on the charge storage component.

Alternately, an expected remaining charge, based upon, for example, a prior reference readout value, may be known and used to establish an expected setpoint or transition point if no thermal events have occurred. The readout circuit 300*a* can then establish that setpoint and detect whether a readout value deviates from the expected value, and if so, determine or indicate that a thermal event may have occurred.

In any embodiment, whether a sense voltage 340 is measured for a given sense current 350 or a sense current 350 is measured for a given sense voltage 340, the determined value (voltage or current) may be used directly as an indication of the remaining charge.

Figure 3B:
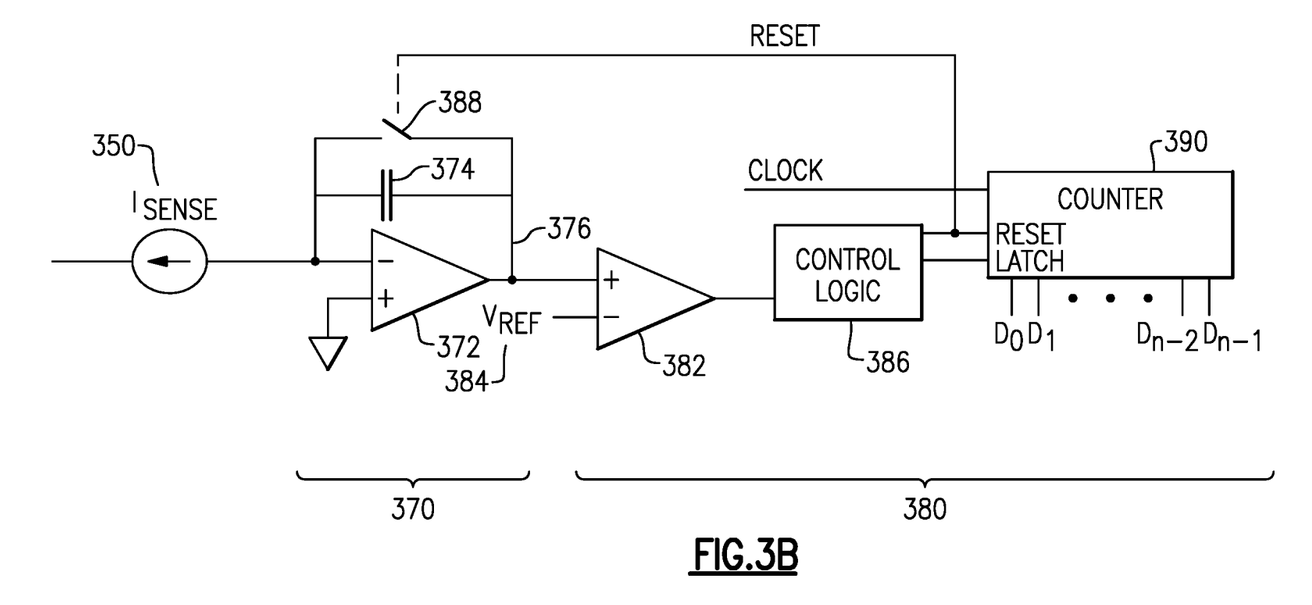
FIG. 3B is a schematic diagram of another example readout circuit in accord with aspects of the present invention.

FIG. 3B shows an example portion of an embodiment of a readout circuit 300*a*, the portion shown measures the sense current 350 and includes an integrator circuit 370 and a counter circuit 380. The integrator circuit 370 includes an op-amp 372 with a feedback capacitor 374 and an output 376 connected as an integrating amplifier. The semiconductor sense channel 232 (see FIGS. 2A-2B) acts as a current source to the integrator circuit 370. The counter circuit 380 includes a comparator 382, a reference voltage 384, a control logic 386, a reset switch 388, and a counter 390. As the sense channel 232 allows sense current 350 to flow, the feedback capacitor 374 charges and the output 376 approaches the reference voltage 384. In this way, the integrator circuit 370 integrates the current over the capacitor 374. The comparator 382 triggers the control logic 386 each time the output 376 reaches the reference voltage 384 (by charging of the feedback capacitor 374), and each time the reference voltage is reached, the control logic 386 resets the integrator circuit 370 by discharging the feedback capacitor 374 through the reset switch 388, and the control logic 386 indicates to the counter 390 that the integrator cycle has completed. The counter 390 measures the time it takes for the integrator cycle to complete, and the time it takes for the integrator cycle to complete is indicative of the sense current 350.

FIGS. 3A and 3B show portions of circuits that may be used in various embodiments as readout circuits as described above. Other embodiments may use additional or different arrangements of circuit components or entirely different readout mechanisms. The example readout circuit components disclosed have been discussed with relation to a particular embodiment of sensing interface 200. Various embodiments of the sensing interface 200 may require different readout mechanisms for compatibility. Likewise, various embodiments of the readout mechanism 300 may require different sensing interfaces. In various embodiments, sensing interface 200 and readout mechanism 300 may include any suitable arrangement for sensing the remaining charge on the charge storage device 100.

In various embodiments, determination of the remaining charge is not literally a numeric determination of the charge, e.g., in coulombs, rather the remaining charge is sensed to determine a value related to or indicative of the charge, such as a readout voltage. Further, a numeric value of, e.g., readout voltage, is an indirect measure that can indicate a relative change in charge. The numeric value may or may not be linearly related to the amount of remaining charge.

For the charge storage device 100 to lose charge, it must begin from a charged state. A combination of the FET components 210, 220, 230 may be used to place (or remove) a charge on the charge storage device 100. For example, and with reference to the simplified illustration of an example charging mechanism 400 shown in FIG. 2B, a voltage level may be applied to the terminals 410, 420 of the tunnel FET 220 in combination with a voltage level applied to the control terminal 310. For example, if a negative voltage is applied to the tunnel terminals 410, 420 and a positive voltage is applied to the control terminal 310, the resulting voltage differential between the control FET 210 and the tunnel FET 220 may be sufficient to cause Fowler-Nordheim (FN) tunneling to deposit electrons onto the charge storage device 100, via the floating gate 112. Similarly, a positive voltage at the tunnel FET 220 and a negative voltage at the control FET 210 may be sufficient to cause Fowler-Nordheim tunneling to remove electrons.

A desired initial charge may be established by, for example, depositing electrons for an expected period of time, sensing the charge as described above, and further depositing or removing electrons until the desired initial charge is attained. The exact amount of actual charge deposited may not be important; it may be sufficient to merely determine the sensed indication of charge (as described above) at an initial point in time.

An alternate method of placing charge on the charge storage device 100 is via Hot Carrier Injection (HCI). In at least one embodiment, the carriers to be placed on the charge storage device 100 are electrons, and accordingly this operation may be referred to as Carrier Hot Electron Injection (CHEI). Again referring to the example embodiment of FIG. 2B, if the control terminal 310 and the drain terminal 410 of the tunnel FET 220 are each connected to a voltage greater than the remaining terminals, a significant field gradient from the left side of the figure to the right may be sufficient to induce electron flow across the structure, some at high velocity (i.e., hot), causing some of the electrons to make their way (i.e., be injected) through the gate oxide layer and onto the floating gate 112, and thereby onto the charge storage device 100.

A set of terminal connections for the various operations for at least one embodiment is shown in Table 1 below. Actual voltages and polarities will depend upon numerous factors, including, for example, substrate materials, doping factors, channel lengths, oxide thicknesses, and other geometries, etc., and may be different for different embodiments.

TABLE 1

Example Values for an Embodiment of FIG. 2B

| | Control Terminal (310) | Tunnel Drain (410) | Tunnel Source/Bulk (420) | Sense Drain (320) | Sense Source/Bulk (330) |
|---|---|---|---|---|---|
| Readout | Varying | GND | GND | Supply | GND |
| FN Deposit | +5 volts | −5 volts | −5 volts | GND | GND |
| FN Remove | −5 volts | +5 volts | +5 volts | GND | GND |
| HCI Deposit | +5 volts | +5 volts | GND | GND | GND |

Figure 4A:
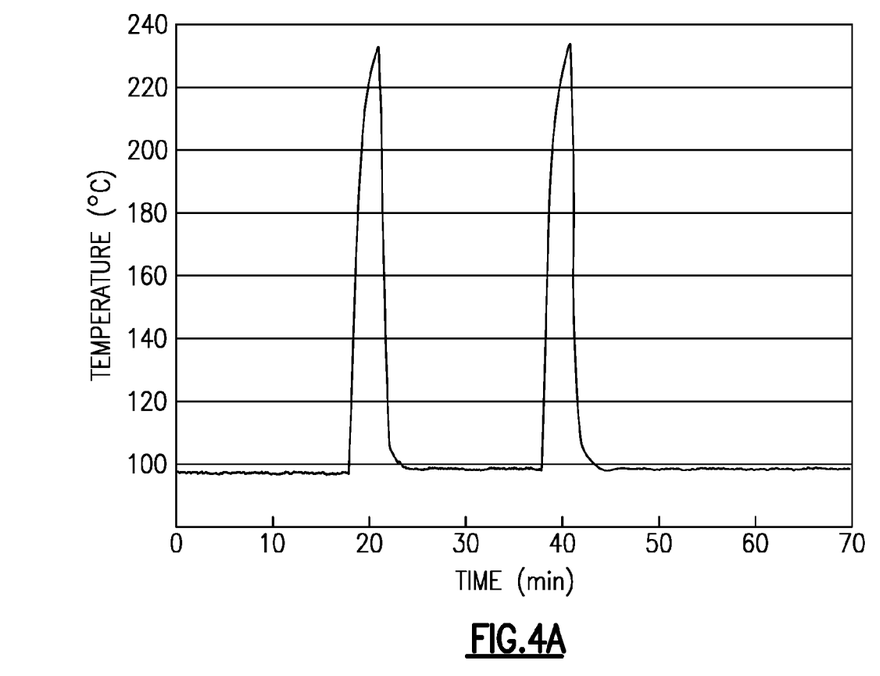
FIG. 4A is a graph of an example temperature exposure over time for a thermal event sensor in accord with aspects of the present invention.
Figure 4B:
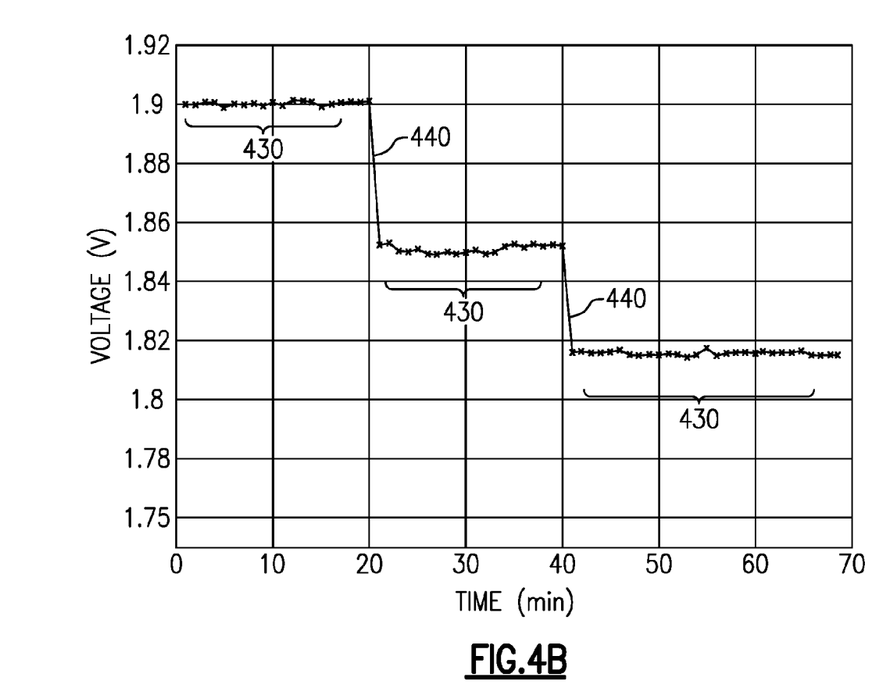
FIG. 4B is a graph of an example charge level response to the temperature exposure of FIG. 4A for a thermal event sensor in accord with aspects of the present invention.

In various embodiments, a readout voltage, e.g., the sense voltage 340, indicates the charge on the charge storage device 100. FIGS. 4A and 4B are graphs illustrating the response to a temperature profile of a thermal event sensor in accord with aspects and embodiments disclosed herein, over a time period during which the sensor is exposed to two thermal events. FIG. 4A shows the temperature exposure of the sensor, and FIG. 4B shows the corresponding readout voltage, which is indicative of the charge remaining on the charge storage device 100. In the illustrated scenario, the temperature was maintained just under 100 C as a nominal operating temperature. Thermal events, or temperature excursions, were applied at around 20 minutes and 40 minutes in the illustration, wherein the temperature is raised to approximately 230 C for a brief period. The lower graph shows that during nominal periods 430 when the temperature is maintained at a nominal level the charge on the charge storage device 100 remains substantially constant, while during thermal events 440 the charge substantially decreases.

Over a broader time period, potentially including the full lifetime of a thermal event sensor in accord with aspects and embodiments disclosed herein, the thermal event sensor can indicate if a component, device, or system has been exposed to a temperature substantially higher than a nominal operating temperature. As discussed above, exposure to a temperature excursion may be evidence of tampering with the component, device, or system.

Figure 5:
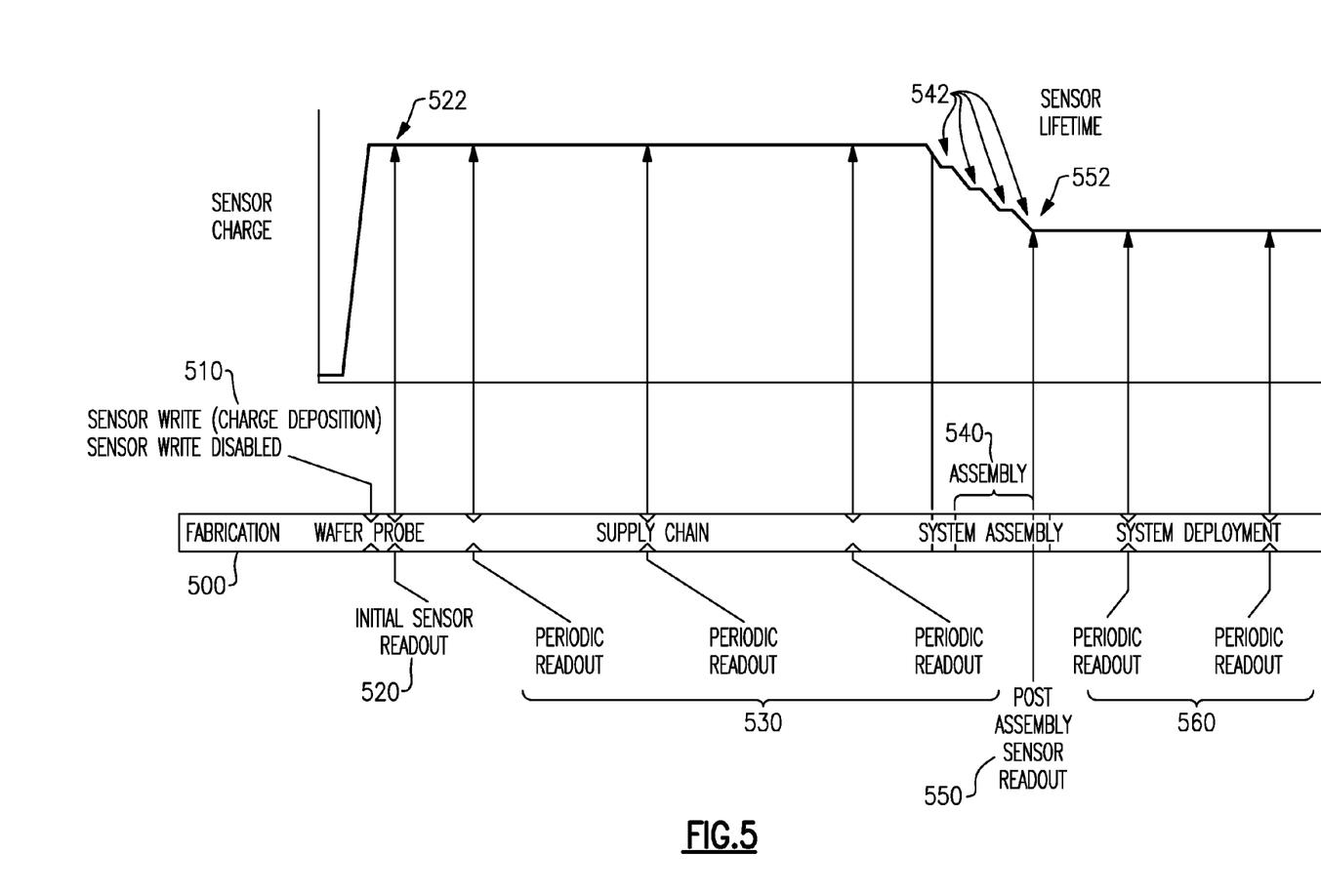
FIG. 5 is an illustration of one charge level response for an example lifetime of a thermal event sensor in accord with aspects of the present invention.

An example lifetime of a thermal event sensor in accord with aspects and embodiments disclosed herein is illustrated in FIG. 5. The lower portion of FIG. 5 illustrates life events of the sensor while the upper portion is a graph of the charge on the charge storage device 100 (as may be indicated by a readout voltage). The sensor may be fabricated at time 500 on part of a wafer or semiconductor die. Once fabricated, an initial charge may be placed on the charge storage device 100, as discussed above, at time 510. After depositing an initial charge, the charging mechanism may be disabled or even destroyed to prevent tampering with the sensor by re-establishing a new charge. The initial charge may be readout at time 520 and recorded to establish a reference value 522, the initial sensor readout, so any future thermal events that cause charge loss may be detected. The sensor, or the part or component in which the sensor is integrated, may pass through a supply chain involving packing, storing, shipping, warehousing, etc. during time 530 and the sensor may be readout at periodic intervals during this period to confirm that no charge loss has occurred, i.e., that no exposure to temperature excursions have occurred.

Eventually the sensor, part, or component, will be assembled into a device, product, or system during time 540. During assembly, the sensor, part, or component may be exposed to temperature excursions as expected during work, soldering, reflow, and rework, while it is being assembled into a device or system. Accordingly, during the assembly time 540 the charge on the charge storage device 100 may decrease as indicated by decreasing charge levels 542. When final assembly is complete, at post-assembly time 550, a post-assembly readout may establish a new post-assembly reference value 552. Periodic readouts while the system is in deployment 560 may be compared to the reference value 552 to determine if the sensor has been exposed to temperature excursion events, which may indicate tampering.

In various embodiments or applications, a sensor lifetime and charge profile may differ from that described above. For example, some handling may occur prior to the initial sensor readout at time 520 that may expose the sensor to higher temperatures and cause charge loss, such as a packaging step, for example, and thus the reference value 522 may be lower than the initial charge placed at time 510. Further, there may be additional expected handling in the supply chain that reduces the charge and new reference values may be established (and authorized or authenticated) prior to system assembly at time 540. Actual lifetime events and charge profiles will differ and may depend on numerous factors, and may be accommodated for changing operational parameters or application.

While details have been described regarding at least one embodiment of a charge storage device 100 and supporting sensing interface 200 and readout mechanism 300, various embodiments may include additional supporting circuitry integrated with the sensor and may include additional equipment and functionality to work in cooperation with the sensor. For example, a sensor in accord with aspects and embodiments disclosed herein including a charge storage device 100, a sensing interface 200, and a readout mechanism 300, may also include a radio frequency (RF) interface, such as RFID, Bluetooth, Zigbee, Wi-Fi, cellular, etc. to support wireless interrogation of the sensor. The sensor may include memory or data storage programmed with a unique identifier reported along with the readout value (e.g., readout voltage). A handheld or fixed interrogator may provide an RF signal that triggers a response by the sensor to provide its unique identifier and the current readout value. The sensor may record each interrogation or readout value in memory or data storage. The interrogator may further record the readout value, the unique identifier, and a date-time group in a database. When reference values are recorded, they may be sent to a record authority to be recorded in a database for future reference, as an authenticated reference value. Sensor readouts conducted at periodic intervals may compare the readout value with the reference value from the record authority.

Figure 6:
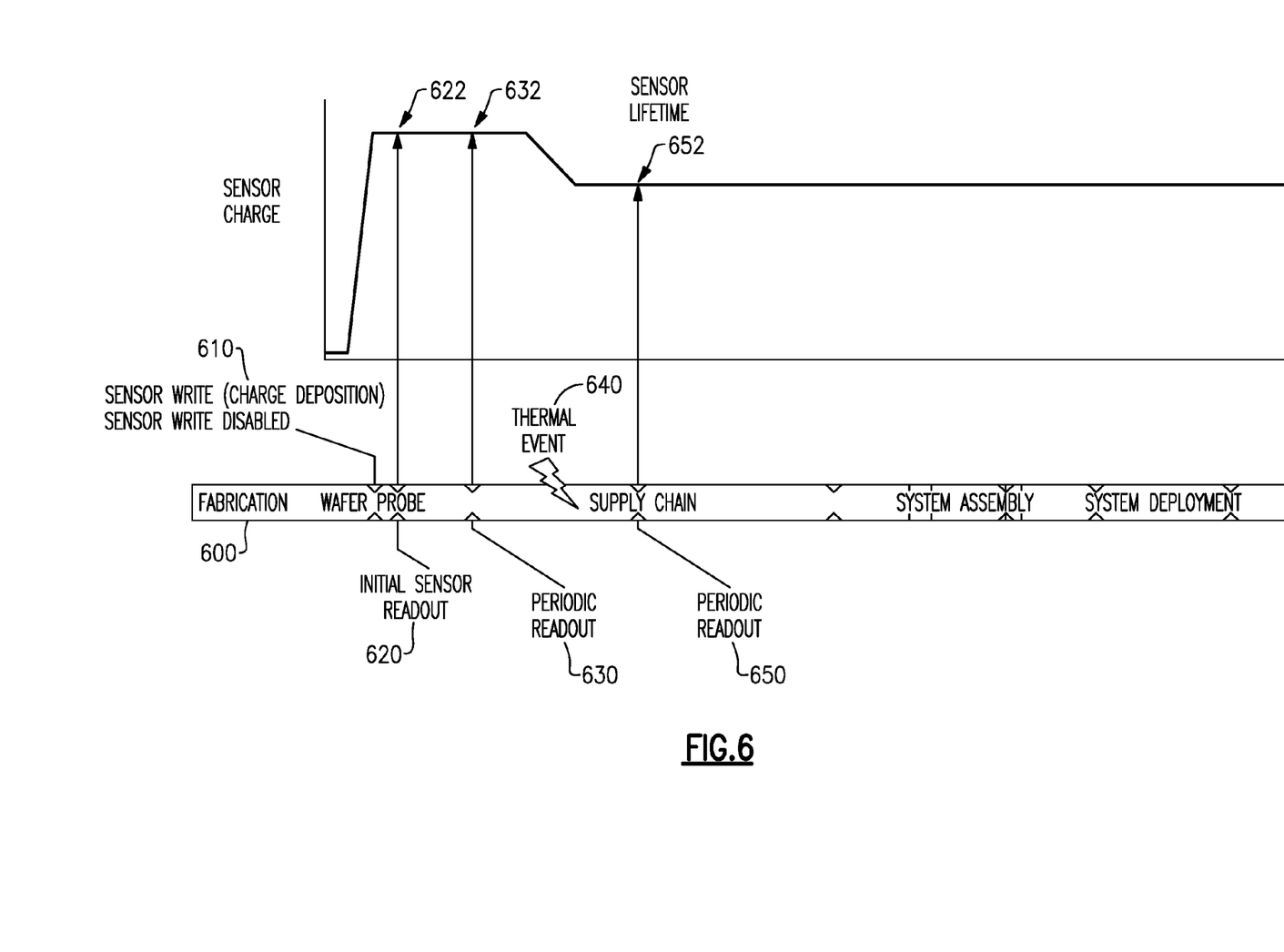
FIG. 6 is an illustration of another charge level response for an example lifetime of a thermal event sensor in accord with aspects of the present invention.

FIG. 6 illustrates an example of detecting a tampering event using a sensor in accord with various aspects and embodiments disclosed herein. The illustration of FIG. 6 is similar to FIG. 5, showing a sequence of life events of the sensor in the lower portion and a graph of the charge on the charge storage device 100 in the upper portion. The sensor is fabricated at time 600 as part of a wafer or die and may be integrated to a specific part or component, e.g., a packaged integrated circuit. An initial charge is placed on the charge storage device 100 at time 610 and the charging mechanism is destroyed. The initial charge is sensed, e.g., readout, at time 620 and a reference value 622 is recorded with a central authority, e.g., the manufacturer of the integrated circuit. The sensor may be shipped to a distributor, who conducts a periodic readout at time 630 and compares the period value 632 to the reference value 622 to confirm the part has not been exposed to a temperature excursion. In FIG. 6 a thermal event occurs at time 640. The thermal event could indicate a person taking this particular part and soldering it onto a circuit board, for example. The part may then be later removed from the circuit and placed back into the inventory of new parts, however the soldering and desoldering activities could have significantly damaged the part's resilience to failure or shortened its lifespan. Embodiments of the thermal event sensor disclosed herein provide a way to detect this possible tampering, and to provide an alert. A later periodic readout at time 650 will have a readout value 652 lower than the reference value 622 (and lower than the prior periodic value 632), which indicates that the part (the sensor) experienced a temperature excursion, indicating possible tampering, since either of the initial readout at time 620 or the previous periodic readout at time 630.

Thus, aspects and embodiments have been disclosed that provide a thermal event sensor. In various embodiments, the thermal event sensor is CMOS-compatible capable of creating a readable indication of temperature history without requiring power or active external control during the sensing period. The thermal event sensor enables low-power and low-cost capability to monitor for and detect exposure to temperature excursions.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A thermal event sensor comprising:
   a charge storage component formed on a substrate including a floating gate and a plurality of metal layers, the plurality of metal layers being electrically coupled to one another and the floating gate, separated by corresponding layers of field oxide, and configured to hold an initial charge and to lose charge at a rate dependent upon a temperature of the charge storage component;
   a sensing interface including at least one field effect transistor channel in proximity to the floating gate, the at least one field effect transistor channel being coupled to the floating gate through a gate oxide; and
   a readout mechanism coupled to the sensing interface and configured to sense a remaining charge on the charge storage component without substantially altering the remaining charge, and configured to provide a readout value indicative of the remaining charge.

2. The sensor of claim 1 wherein the floating gate is formed of a single layer of polysilicon material.

3. The sensor of claim 1 wherein the sensing interface includes at least two field effect transistor channels coupled to the floating gate, the at least two field effect transistor channels formed in a lateral configuration to each other.

4. The sensor of claim 1 wherein the sensing interface further includes a control gate in proximity to the floating gate.

5. The sensor of claim 1 wherein the readout mechanism is a readout circuit coupled to the field effect transistor channel and the readout circuit is configured to detect a sense current through the field effect transistor channel.

6. The sensor of claim 1 further comprising a charging mechanism coupled to the sensing interface and configured to place an initial charge on the charge storage component.

7. The sensor of claim 6 wherein the charging mechanism is configured to place the initial charge on the charge storage component via at least one of Fowler-Nordheim tunneling and hot carrier injection.

8. The sensor of claim 6 wherein the charging mechanism is configured to be disabled after placing the initial charge on the charge storage component.

9. The sensor of claim 1 wherein the charge storage component includes a doped dielectric configured to hold the initial charge by trapping the initial charge.

10. A method of detecting thermal events, the method comprising:
    providing, via a charging mechanism, a first charge on a charge storage component at a first time, the charge storage component including a plurality of metal layers electrically coupled to one another and separated by corresponding layers of field oxide, the first charge being provided by depositing charge on the plurality of metal layers, and the charge storage component configured to lose charge at a rate corresponding to temperature;
    sensing a remaining charge on the charge storage component at a second time; and
    comparing the sensed remaining charge to the first charge.

11. The method of claim 10 wherein sensing the remaining charge includes sensing a conductivity of a transistor channel in proximity to the charge storage component, the remaining charge influencing a field effect on the transistor channel.

12. The method of claim 10 further comprising determining whether the charge storage component has been exposed to a thermal event based upon the comparison.

13. The method of claim 10 further comprising disabling the charging mechanism after providing the first charge.

14. A method of detecting temperature variations, the method comprising:
    providing, via a charging mechanism, a first charge on a charge storage component at a first time, the charge storage component including a plurality of metal layers electrically coupled to one another and separated by corresponding layers of field oxide, the first charge being provided by depositing charge on the plurality of metal layers, and the charge storage component configured to lose charge at a rate corresponding to temperature;
    determining an expected charge remaining on the charge storage component at a second time;
    sensing a second charge remaining on the charge storage component at the second time;
    comparing the second charge to the expected charge; and
    determining based on the comparison whether the charge storage component has been exposed to a temperature variation outside of an allowed range.

15. The method of claim 14 wherein sensing the remaining charge includes sensing a conductivity of a transistor channel in proximity to the charge storage component, the remaining charge influencing a field effect on the transistor channel.

16. The method of claim 14 further comprising disabling the charging mechanism after providing the first charge.

17. A thermal event sensor comprising:
    a charge storage component formed on a substrate including a plurality of metal layers electrically coupled to one another and a doped dielectric configured to hold an initial charge by trapping the initial charge, the charge storage component configured to lose charge at a rate dependent upon a temperature of the charge storage component;
    a sensing interface coupled to the charge storage component; and
    a readout mechanism coupled to the sensing interface and configured to sense a remaining charge on the charge storage component without substantially altering the remaining charge, and configured to provide a readout value indicative of the remaining charge.

* * * * *